United States Patent [19]

Malocha et al.

[11] Patent Number: 5,034,793
[45] Date of Patent: Jul. 23, 1991

[54] TIME DELAY MODULATION AND CORRECTION DEVICE

[75] Inventors: Donald C. Malocha, Longwood, Fla.; Frederick M. Fliegel, Tempe; Frederick Y. Ch, Scottsdale, both of Ariz.

[73] Assignee: Motorola, Inc., Schaumburg, Ill.

[21] Appl. No.: 489,998

[22] Filed: Mar. 5, 1990

[51] Int. Cl.$^5$ ............... H01L 29/84; H01L 29/96; H01L 23/48; H01L 29/40
[52] U.S. Cl. .................... 357/26; 357/65; 310/313 R; 333/154; 333/165
[58] Field of Search ............... 357/26, 65; 310/313 R, 310/313 B, 313 C, 313 D; 333/150, 151, 152, 153, 154, 165

[56] References Cited

U.S. PATENT DOCUMENTS

| | | | |
|---|---|---|---|
| 3,908,137 | 9/1975 | Hunsington et al. | 337/26 |
| 4,434,383 | 2/1984 | Cho et al. | 357/26 |
| 4,633,285 | 12/1986 | Hunsinger et al. | 357/26 |

OTHER PUBLICATIONS

W. J. Tanski et al., "Heterojunction Acoustic Charge Transport Devices on GaAs", *Applied Physics Letters*, vol. 52 (Jan. 1988) pp. 18–20.

Frederick M. Fliegel et al., "Performance of Acoustic Charge Transport Chirp Filters" *IEEE Transactions on Microwave Theory and Technologies*, vol. MTT-35 (Dec. 1987), pp. 1164–7.

R. W. Miller et al., "an Acoustic Charge Transport Digitally Programmable Transversal Filter", *IEEE Journal of Solid-State Circuits*, vol. 24 (Dec. 1989) pp. 1675–1682.

G. A. Peterson et al., "Charge Confinement in Heterojunction Acoustic Charge Transport Devices", *Applied Physics Letters*, vol. 55 (Sep. 1989) pp. 1330-2.

B. C. Beggs et al., "Optical Charge Injection into Gallium Arsenide Acoustic Charge Transport Device", *Journal of Applied Physics*, vol. 63 (Apr. 1988), pp. 2425–2430.

R. N. Sacks et al., "Acoustic Charge Transport in an (Al,Ga)As/GaAs Heterojunction Structure Grown by Molecular-Beam Epitaxy", *Journal of Vacuum Science & Technology* vol. B6 (2) (Mar./Apr. 1988), pp. 685-7.

*Primary Examiner*—J. Carroll
*Attorney, Agent, or Firm*—Frank J. Bogacz; Jordan C. Powell

[57] ABSTRACT

An acoustic charge transport device (ACT) alters the intersection of an associated surface acoustic wave (SAW) electric potential with the static depletion potential and the input contact potential to correct the timing variations inherent in conventional ACT devices. The ACT device incorporates a pair of correcting electrodes secured to the ACT channel on either side of an input electrode. The electrodes vary the depth of the electric potential of the SAW which ensures sampling of the input signals at consistent times.

11 Claims, 3 Drawing Sheets

TIME DELAY MODULATION AND CORRECTION DEVICE

BACKGROUND OF THE INVENTION

This invention relates, in general, to surface acoustic wave (SAW) devices, and more specifically, to acoustic charge transport (ACT) devices.

ACT is a relatively new technology relating to SAW devices. ACTs can perform many functions such as delay and transversal filtering, and are formed on Gallium Arsenide (GaAs) substrates to take advantage of the high processing speed of GaAs.

As explained in U.S. Pat. No. 4,633,285, issued Dec. 30, 1986 to Billy Jo Hunsinger and assigned to University of Illinois, an ACT comprises a buried channel formed by placing a piezoelectric semiconductor material between confining layers of doped GaAs. A SAW is then generated within the piezoelectric layer. As the SAW propagates through the piezoelectric layer, charge representing an input signal is injected into the wells of the SAW from which majority carriers have been depleted. The charge representing the signal is carried by the SAW below the electrodes which are capacitively coupled to the piezoelectric layer. The electrodes can sense the magnitude of the charge in each SAW well without actually extracting charge from the signal. This process is termed non-destructive sensing since the capacitively extracted charge magnitude does not deplete the charge in the SAW well.

Each SAW has an associated electrical potential which allows the charge representing the input signal to be carried. The potential of the SAW has an impact on the amplitude of the input signal. The signal, or associated charge, is very non-viscous. In other words, the direction of motion of the charge can change almost instantaneously. The direction of motion of the charge is determined by the electrical potential between the input contact and the SAW potential curve. When the SAW potential is negative with respect to the input contact, charge will flow towards the SAW. When the potential difference is positive, charge will flow back to the contact. At a potential difference of zero, no charge will flow, and an effective "break" between the contact and the SAW will occur.

Varying the input charge magnitude to a constant SAW potential causes the breaking point between the input contact and the SAW to vary. This variance results in samples of the signal to be taken other than at the exact desired periodic sample time. When the signal is sampled other than at the appropriate sample time, the signal, as read by a subsequent filter, becomes distorted. This distortion has been found in all ACT devices to date. With the need for clear and precise communication devices, this distortion is unacceptable.

SUMMARY OF THE INVENTION

Accordingly, it is an advantage of the present invention to provide an ACT device which assures accurate timing of signal inputs to a propagating SAW.

An acoustic charge transport device (ACT) alters the intersection of an associated surface acoustic wave (SAW) electric potential with the static depletion potential and the input contact potential to correct the timing variations inherent in conventional ACT devices. The ACT device incorporates a pair of correcting electrodes secured to the ACT channel on either side of an input electrode. The electrodes vary the depth of the electric potential of the SAW which ensures sampling of the input signals at consistent times.

The above and other objects features, and advantages of the present invention will be better understood from the following detailed description taken in conjunction with the accompanying drawings.

DETAILED DESCRIPTION OF THE INVENTION

Acoustic charge transport (ACT) filters are surface acoustic wave (SAW) devices which include non-destructive charge sensing abilities. An ACT comprises a buried channel formed by placing a piezoelectric semiconductor material between confining layers of doped GaAs (gallium arsenide). A SAW is then generated within the piezoelectric layer. A charge representing an input signal is disposed within wells of the SAW as it propagates through the GaAs structure. As the SAW passes underneath electrodes on the surface of the GaAs structure, electrical charge within each of the wells which represent the input signal are capacitively measured. None of the electric charge is removed from the wells in the channel. The charge in each well may be sampled by many electrodes as the SAW wave continues to propagate throughout the GaAs structure. The SAW wave propagates throughout the GaAs structure very slowly compared to electromagnetic waves propagating through GaAs. The slow speed of the propagation facilitates accurate delayed sampling. As the SAW wave passes under each electrode, a new delayed sample of the signal is obtained. This provides a filtering function known as transversal filtering which is often used in communication applications to discriminate between different frequencies. A basic description of the ACT process is described in U.S. Pat. No. 4,633,285, issued Dec. 30, 1986 to Billy Jo Hunsinger, et al., and assigned to the University of Illinois.

An input signal to an ACT device results in a series of charge packets through a non-linear interaction with the SAW clock signal. The charge packets are the amplitudes of the input signal wave sampled at intervals determined by the SAW clock. The sampling aperture over which the magnitude of the charge packet is determined is very narrow. Measurements have shown that the aperture is about five percent (5%) of a clock cycle in width. This narrow interval varies in position within a clock cycle in proportion to the amplitude of the input signal. Larger packets result in phase retardation compared to smaller packets. The variation in position creates errors in the input signal sampling process through an amplitude modulation to phase modulation conversion process. The resulting phase distortion of the stored signal is undesirable.

Figure 1A:
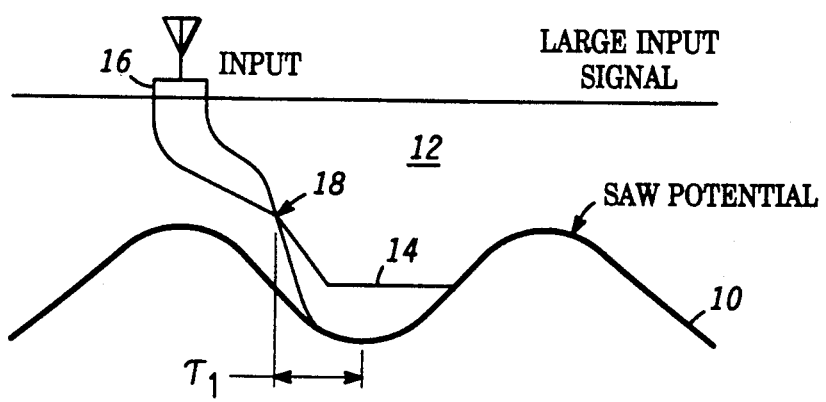
FIG. 1, parts A and B show a conventional ACT input and the effects of varying signal magnitudes on an associated charge deposited within a propagating SAW.
Figure 1B:
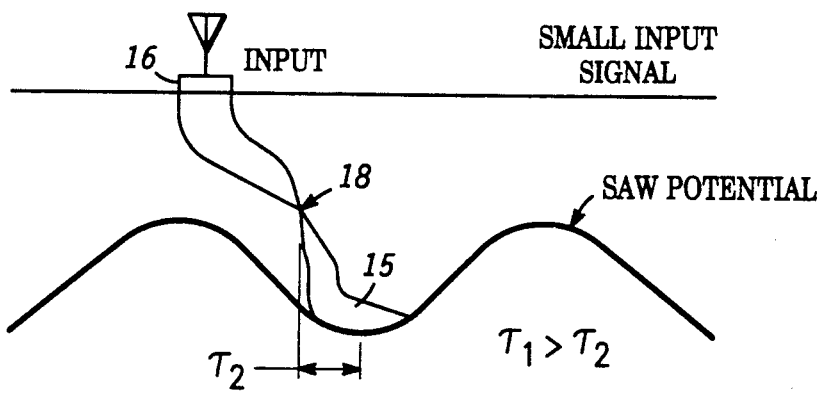

FIGS. 1a and 1b illustrate the phase distortion process of conventional ACT devices. In FIG. 1a, a SAW electrical potential wave 10 is shown propagating through a piezoelectric layer 12. SAW electrical potential wave 10 is not the mechanical/acoustic SAW, but rather the electrical potential caused by the mechanical/acoustic SAW as it propagates through the same layer 12. A charge packet 14 is deposited in the well of wave 10 by input electrode 16. A breaking point 18 of the deposited charge packet 14 from electrode 16 is time $\tau_1$ from the center of the well of wave 10.

The flow of the electrons of charge packet 14 depends upon the electrical potential between wave 10 and electrode 16. The electrical potential difference will be greatest as the center of the well passes under electrode 16, and the electrons of charge packet 14 will flow to the well. If the potential shifts towards electrode 16, the electrons of charge packet 14 will flow towards electrode 16. At zero potential difference, no electrons will flow and electrode 16 will be disconnected from any charge packet 14 within the well of wave 10.

Figure 2:
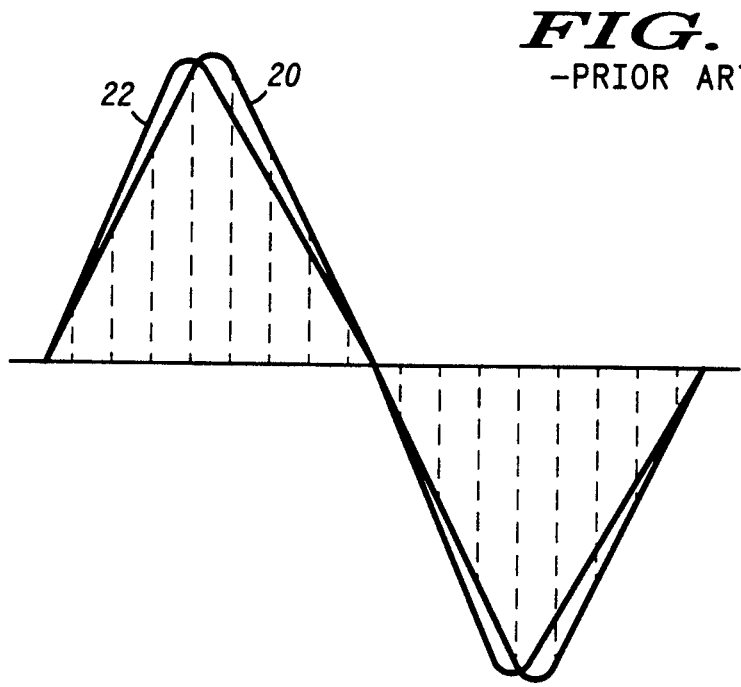
FIG. 2 shows the sampling effects of ACT devices on a sinusoidal input signal.

The electrical potential between wave 10 and electrode 16 is also affected by the amplitude of charge packet 14. If charge packet 14 is great, the potential is great and the time from the center of the well will be large compared to a smaller amplitude charge. This is illustrated in FIG. 1b. A smaller amplitude charge packet 15 is deposited in the well of wave 10. Since the amount of charge in the packet is substantially smaller, the potential difference is less than that of FIG. 1a and the time from center of the well to zero potential difference is $\tau_2$. Then $\tau_1 > \tau_2$, and the sampling time of the points of the signal due to the difference in magnitude of the samples is shifted. FIG. 2 illustrates the effect of the changed sampling times. A signal having the sine wave 20 would be distorted such as illustrated by wave 22.

Figure 3:
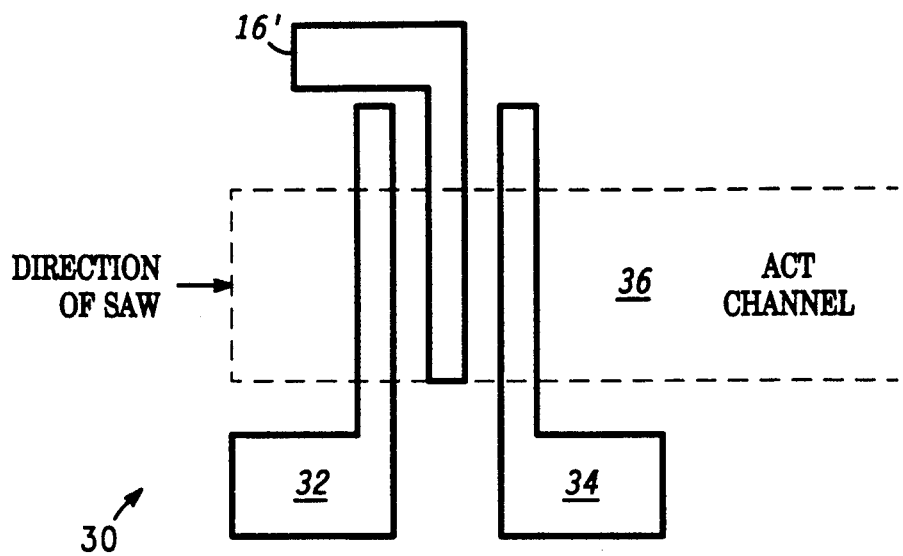
FIG. 3 is a timing error corrector device according to the present invention.

FIG. 3 shows an input phase correction device 30 of the present invention in its preferred embodiment. Two electrodes 32 and 34 are placed on either side of input 16'. Both electrodes 32 and 34, and input 16' extend across an ACT channel 36 through which the SAW propagates.

Figure 4:
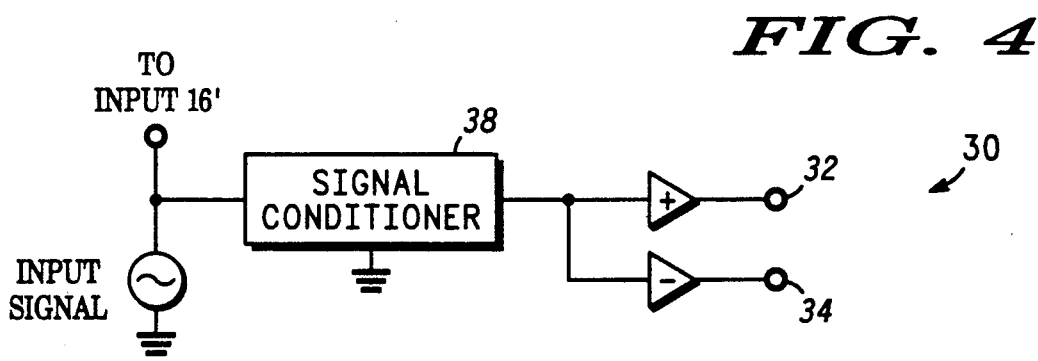
FIG. 4 is an electrical schematic of the timing error corrector device according to the present invention.

FIG. 4 shows an electric schematic of device 30. The input signal is split between input 16' and a signal conditioner 38. Signal conditioner 38 is preferably a detector, such as a diode, followed by a low pass filter to smooth the input signal prior to electrodes 32 and 34. Although signal conditioner 38 is defined in its preferred embodiment as a detector and low pass filter, other signal conditioners may be employed. In this embodiment, signal conditioner 38 comprises a diode to rectify the flow of current towards electrodes 32 and 34, and a capacitor to electric ground (neither shown in FIG. 4).

Since the bias on electrodes 32 and 34 is derived from the input signal, the depth of the well of SAW 10 will vary according to the magnitude of the bias of the input signal on input 16'. By varying the depth of the potential beneath input 16', the intersection of SAW potential 10 with a static depletion potential and the input contact potential is varied. In other words, the time from the center of the well to zero potential may be adjusted by moving SAW potential 10. Depending on the magnitude of the input charge packet, SAW potential 10 may be varied up or down. As SAW potential 10 is varied, $\tau_1 = \tau = \tau_2$ where the time at which charge packet 14' disconnects from input 16' is a constant for all signals, whether they have large or small magnitudes. Centroid 40 depicts a dip in SAW potential 10 where the input signal magnitude is large. When the input signal magnitude is relatively small, SAW potential 10 will be drawn closer towards the surface of piezoelectric layer 12. Electrode 34 has opposite bias from electrode 32. The bias on electrode 34 may, but need not, be equal in magnitude from the bias on electrode 32. The opposite bias restores SAW potential 10 to its original potential, or some other potential close to original.

Figure 6:
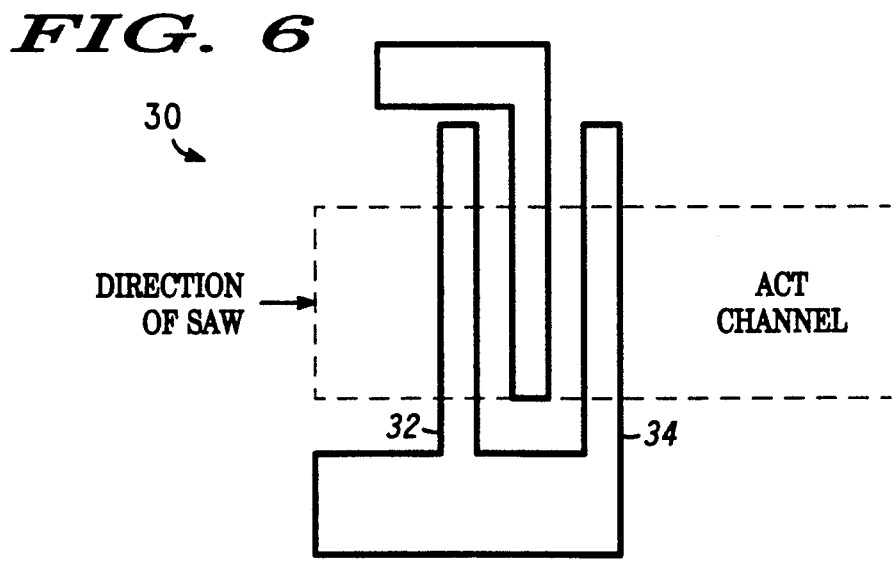
FIG. 6 is a second embodiment of the present invention.
Figure 5:
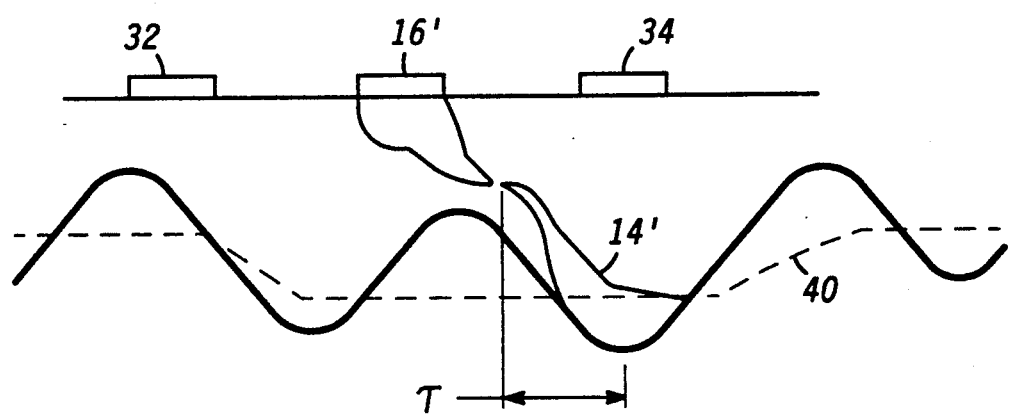
FIG. 5 shows the effect of the present invention on the electric potential of a propagating SAW.

A second embodiment of input phase correction device 30 is shown in FIG. 6. In this embodiment, electrodes 32 and 34 are coupled together. Therefore, the magnitude of the bias on electrode 34 will be equal and opposite to the magnitude of the bias for electrode 32.

As shown throughout the description of the present invention, varying the depth of SAW potential 10 with electrodes 32 and 34 allows the point of zero potential difference, and thus the disconnect time, to be the same for large and small magnitude signals. This prevents distortion in the signal, and improves the quality of the information received.

Thus there has been provided, in accordance with the present invention, a time delay modulation and correction device that fully satisfies the aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. An electrical signal input device for depositing an electrical signal into a channel of an acoustic charge transport (ACT) surface acoustic wave (SAW) device comprising:
    input means for supplying a plurality of electrical charges representing samples of the electrical signal;
    said input means depositing said plurality of electrical charges into an electrical potential wave of a SAW;
    said SAW propagating through the channel;
    said input means coupled to the electric channel;
    each of said deposited plurality of electric charges representing an amplitude of each of a set of points along a defined electrical wave of the electric signal;
    said each of said points sampled at predetermined times;
    correction means for varying the electrical potential of said electrical potential wave;
    said correction means capacitively coupled to the electric channel;
    said correction means electrically varying the electrical potential of said electrical potential wave before said input means deposits said plurality of electric charges in said electrical potential wave.

2. An ACT electrical signal input device according to claim 1 wherein said correction means comprises:
    first electrode means coupled to the channel in a position before said input means with respect to the direction of the propagation of said SAW; and
    said first electrode means for supplying a bias to said electric potential wave to cause said electric potential wave to vary in electric potential magnitude.

3. An ACT electrical signal input device according to claim 2 wherein said correction means further comprises:
   second electrode means coupled to the electric channel in a position after said input means with respect to the direction of the propagation of said SAW; and
   said second electrode means for supplying a bias to said electric potential wave to cause said electric potential wave to vary in electric potential magnitude.

4. An ACT electrical signal input device according to claim 1 wherein the input device further comprises:
   conversion means coupled to said input means to receive the electric signal from said input means;
   said conversion means coupled to said correction means;
   said conversion means for converting the electric signal to a filtered control bias to supply said filtered control bias to said correction means.

5. An acoustic charge transport (ACT) device for high quality interpretation of an input signal having a sinusoidal wave function, said ACT device comprising:
   medium means for supplying a bounded electrical channel;
   surface acoustic wave (SAW) means for generating a SAW;
   said SAW generated in and propagating through said medium means;
   said SAW having an associated electrical potential;
   input means coupled to said electrical potential and receiving amplitude samples of the sinusoidal wave function;
   said input means for supplying said amplitude samples of the sinusoidal wave function to said electric potential at varied electrical potential magnitudes according to the magnitude of said amplitude samples, said amplitude samples taken at predetermined points along the sinusoidal wave function; and
   read means coupled to said electric potential to receive said amplitude samples supplied by said input means.

6. An ACT device according to claim 5 wherein said input means comprises:
   input element coupled to said electrical potential to supply said amplitude samples to said electrical potential;
   correction means capacitively coupled to said electrical potential;
   said input element and said correction means receiving said amplitude samples; and
   said correction means for varying the electrical potential magnitude of said electrical potential.

7. An ACT device according to claim 6 wherein said correction means comprises:
   first electrode means coupled to said electrical channel and positioned before said input element with respect to the direction of the propagation of said SAW; and
   said first electrode means for supplying a bias to said electrical potential to cause said electric potential to vary in electric potential magnitude.

8. An ACT electrical signal input device according to claim 7 wherein said correction means further comprises:
   second electrode means coupled to said electrical channel and positioned after said input means with respect to the direction of the propagation of said SAW; and
   said second electrode means for supplying a bias to said electrical potential to cause said electrical potential to vary in electric potential magnitude.

9. A method of increasing the quality of samples of a sinusoidal wave input to an acoustic charge transport (ACT) device having a surface acoustic wave (SAW) propagating through a bounded electrical channel, said SAW having an associated electrical potential, said method comprising the steps of:
   varying the electrical potential according to the magnitudes of the samples of the sinusoidal wave, including the step of varying the electrical potential with a driving waveform at the clock frequency of said SAW such that said driving waveform has a particular phase relationship to said SAW clock frequency;
   inputting the samples to the SAW; and
   extracting said input samples from said SAW.

10. A method according to claim 9 wherein the method further comprises the step of varying the magnitude of the electric potential to approximately the original magnitude prior to extracting said input samples from said SAW.

11. A method according to claim 9 wherein said step of varying the electrical potential comprises the steps of:
   filtering the magnitudes of the samples to generate a filtered bias;
   supplying said filtered bias to an electrode; and
   varying the magnitude of the electric potential resulting from varying the distance from the electric potential to said electrode by supplying said filtered bias to the electric potential.

* * * * *

UNITED STATES PATENT AND TRADEMARK OFFICE
CERTIFICATE OF CORRECTION

PATENT NO. : 5,034,793

DATED : July 23, 1991

INVENTOR(S) : Donald Chester Malocha et al.

It is certified that error appears in the above-identified patent and that said Letters Patent is hereby corrected as shown below: Title page:
Item (75);
  The third inventor's name was misspelled. Replace "Frederick Y. Ch" with --Frederick Y. Cho--.

Signed and Sealed this

Twenty-third Day of March, 1993

Attest:

STEPHEN G. KUNIN

Attesting Officer

Acting Commissioner of Patents and Trademarks